US011569108B2

(12) United States Patent
Raga-Barone

(10) Patent No.: US 11,569,108 B2
(45) Date of Patent: Jan. 31, 2023

(54) RETICLE POD CONVERSION PLATE FOR INTERFACING WITH A TOOL

(71) Applicant: GLOBALFOUNDRIES U.S. Inc., Santa Clara, CA (US)

(72) Inventor: Michael Raga-Barone, Ballston Spa, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 284 days.

(21) Appl. No.: 16/901,099

(22) Filed: Jun. 15, 2020

(65) Prior Publication Data

US 2021/0391198 A1    Dec. 16, 2021

(51) Int. Cl.
*H01L 21/673* (2006.01)
*G03F 7/20* (2006.01)

(52) U.S. Cl.
CPC .. *H01L 21/67359* (2013.01); *H01L 21/67393* (2013.01); *G03F 7/70733* (2013.01)

(58) Field of Classification Search
CPC ......... H01L 21/67359; H01L 21/67393; G03F 7/70733; G03F 1/66
See application file for complete search history.

(56) References Cited

U.S. PATENT DOCUMENTS

| | | | |
|---|---|---|---|
| 5,980,183 A | 11/1999 | Fosnight | |
| 6,530,736 B2 | 3/2003 | Rosenquist | |
| 7,578,240 B2 | 8/2009 | Shiwaku | |
| 7,887,277 B2 | 2/2011 | Campbell et al. | |
| 7,972,104 B2 | 7/2011 | Shiwaku et al. | |
| 8,418,733 B2 * | 4/2013 | Shikata | G03F 1/00 414/935 |
| 8,821,099 B2 | 9/2014 | Hall et al. | |
| 10,304,712 B2 | 5/2019 | Ito | |
| 10,607,871 B2 * | 3/2020 | Chiu | G03F 1/66 |
| 10,670,976 B2 * | 6/2020 | Hsueh | H01L 21/67353 |
| 2006/0051188 A1 | 3/2006 | Hosino | |
| 2008/0056864 A1 | 3/2008 | Wada et al. | |

OTHER PUBLICATIONS

U.S. Appl. No. 16/659,090, entitled "Conversion Plate for Reticle Pod Storage and a Reticle Pod Storage System," filed Oct. 21, 2019.

* cited by examiner

*Primary Examiner* — Hung V Nguyen
(74) *Attorney, Agent, or Firm* — Francois Pagette; Hoffman Warnick LLC

(57) ABSTRACT

An illustrative device disclosed herein includes a plate and a reticle pod receiving structure on the front surface of the plate that at least partially bounds a reticle pod receiving area on the front surface. In this example, the back surface of the plate has a pin engagement structure that is adapted to engage a plurality of pins and a fluid flow channel that is adapted to allow fluid communication with an interior region of a reticle pod when the reticle pod is positioned in the reticle pod receiving area.

20 Claims, 16 Drawing Sheets

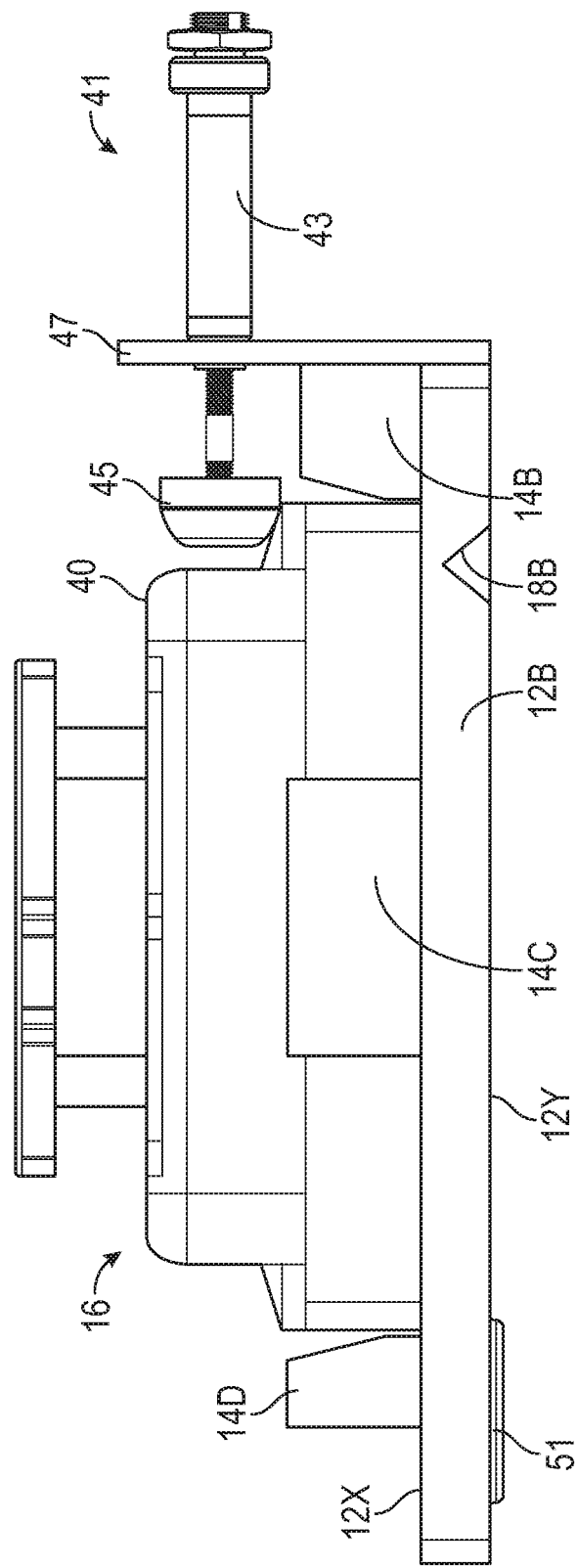

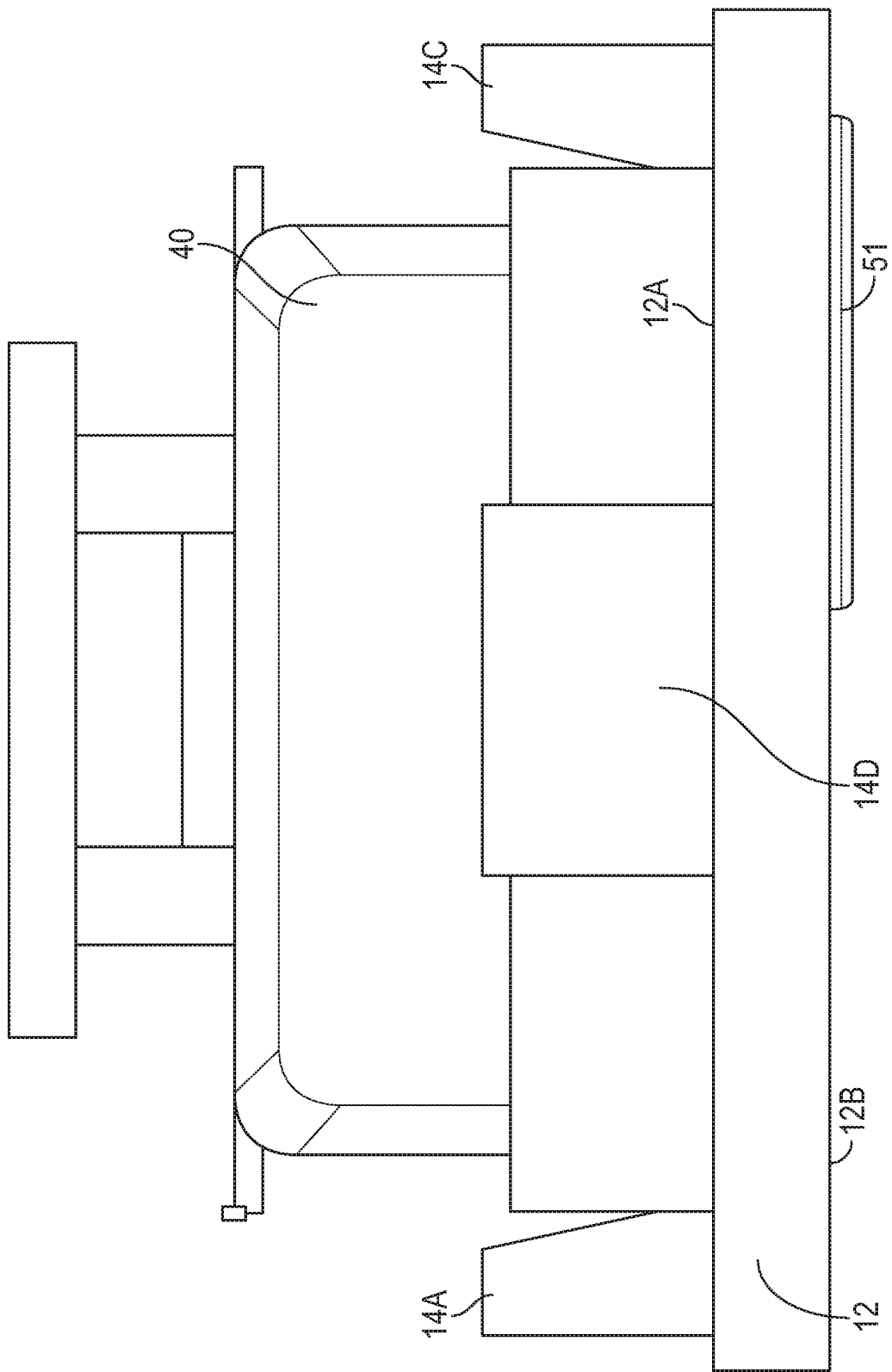

RETICLE POD CONVERSION PLATE FOR INTERFACING WITH A TOOL

BACKGROUND

Field of the Invention

The present disclosure generally relates to various embodiments of a novel reticle pod conversion plate for interfacing with a tool and methods of using such a conversion plate.

Description of the Related Art

Reticles are used in manufacturing integrated circuit products. A reticle contains a pattern that is desired to be formed on a semiconductor substrate (or wafer) where the integrated circuits are formed. A typical reticle comprises a quartz plate with the pattern defined in a thin layer of chrome on one side of the reticle. Photolithography tools and techniques are used to project the image on the reticle onto the surface of a layer of photoresist material that is formed on the surface of the wafer. Thereafter, the layer of photoresist material is developed so as to produce a patterned mask layer that contains the image on the reticle. Reticles are expensive to manufacture and must be handled with care so as to not damage the pattern defined in the reticle.

Reticles must also be safely stored when not in use and readily retrievable when needed. Typically, a single reticle is stored in an interior region of a protective reticle pod. When the reticle pod (with the reticle therein) is positioned on a purged storage location, a pressurized inert gas is introduced into the interior region of the reticle pod. Various processing operations are performed on reticle pods to ensure that they are appropriate for use in storing reticles, such as moisture testing, testing for particle contamination, cleaning, etc. These various operations are performed by sophisticated tools within the fabrication facility where integrated circuit products are fabricated.

The present disclosure is generally directed to various embodiments of a novel reticle pod conversion plate for interfacing with a tool and methods of using such a conversion plate.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a novel reticle pod conversion plate for interfacing with a tool and methods of using such a conversion plate. An illustrative device disclosed herein includes a plate and a reticle pod receiving structure on the front surface of the plate that at least partially bounds a reticle pod receiving area on the front surface. In this example, the back surface of the plate has a pin engagement structure that is adapted to engage a plurality of pins and a fluid flow channel that is adapted to allow fluid communication with an interior region of a reticle pod when the reticle pod is positioned in the reticle pod receiving area.

Another illustrative device disclosed herein includes a plate and a reticle pod receiving structure on the front surface of the plate that at least partially bounds a reticle pod receiving area on the front surface. In this example, the device also includes an opening extending from the front surface of the plate to the back surface of the plate and an engagement surface positioned adjacent the opening, wherein the engagement surface has a surface that is positioned at a level that is below a level of the front surface of the plate.

Yet another illustrative device disclosed herein includes a plate and a reticle pod receiving structure on the front surface of the plate that at least partially bounds a reticle pod receiving area on the front surface. In this example, the device also includes a reticle pod plate securement mechanism that is operatively coupled to at least one of the plate or the reticle pod receiving structure, wherein the reticle pod plate securement mechanism is adapted to engage a surface of a reticle pod to secure the reticle pod in the reticle pod receiving area.

BRIEF DESCRIPTION OF THE DRAWINGS

The disclosure may be understood by reference to the following description taken in conjunction with the accompanying drawings (which are not to scale), in which like reference numerals identify like elements, and in which:

FIG. 12 is a side view of one illustrative embodiment of a novel reticle pod conversion plate disclosed herein with an illustrative reticle pod positioned thereon;

FIG. 13 is another side view of one illustrative embodiment of a novel reticle pod conversion plate disclosed herein with an illustrative reticle pod positioned thereon;

Figure 1:
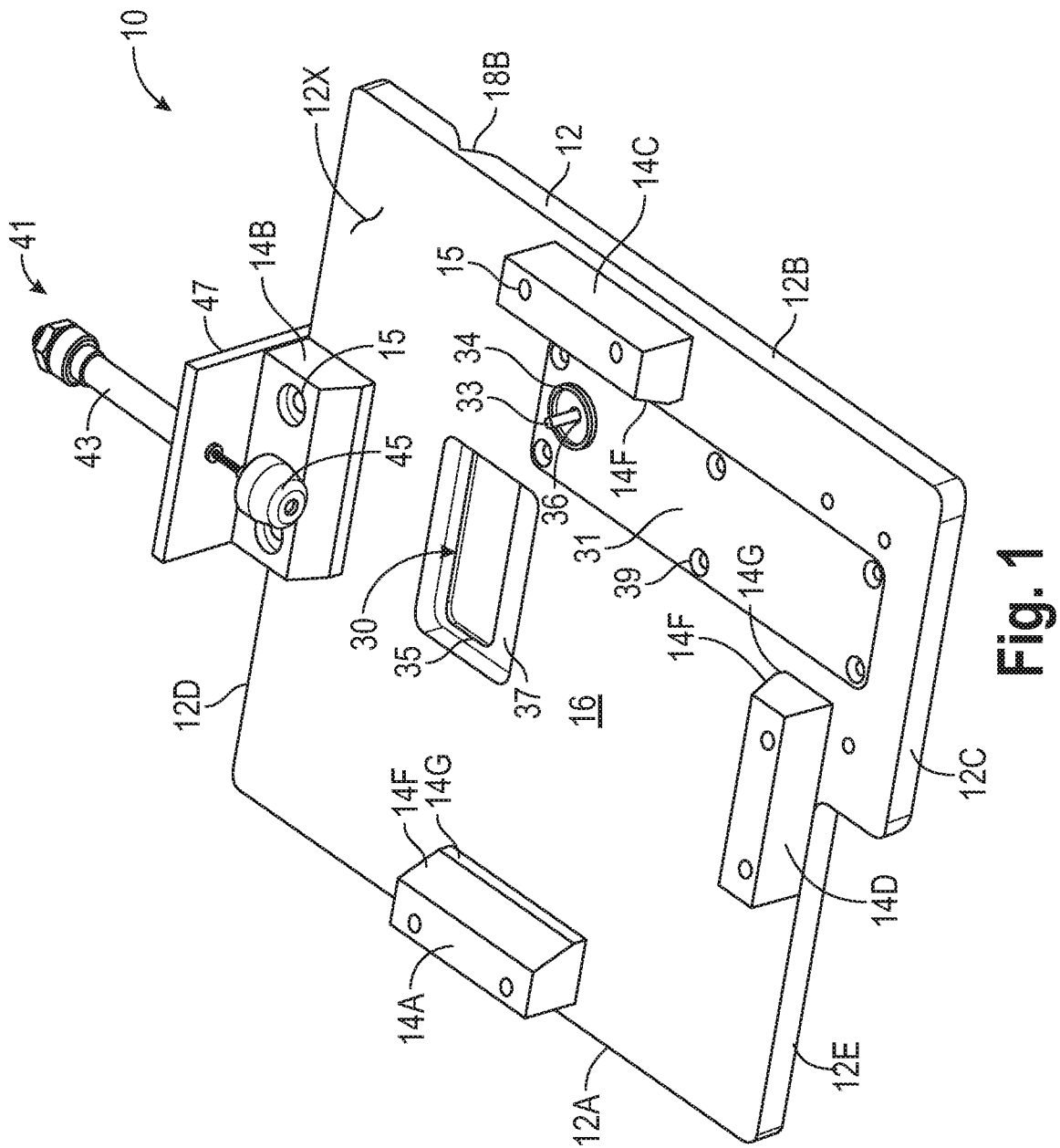
FIG. 1 is a top perspective view of one illustrative embodiment of a novel reticle pod conversion plate disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. With reference to the attached figures, various illustrative embodiments of the devices, systems and methods disclosed herein will now be described in more detail.

Figure 2:
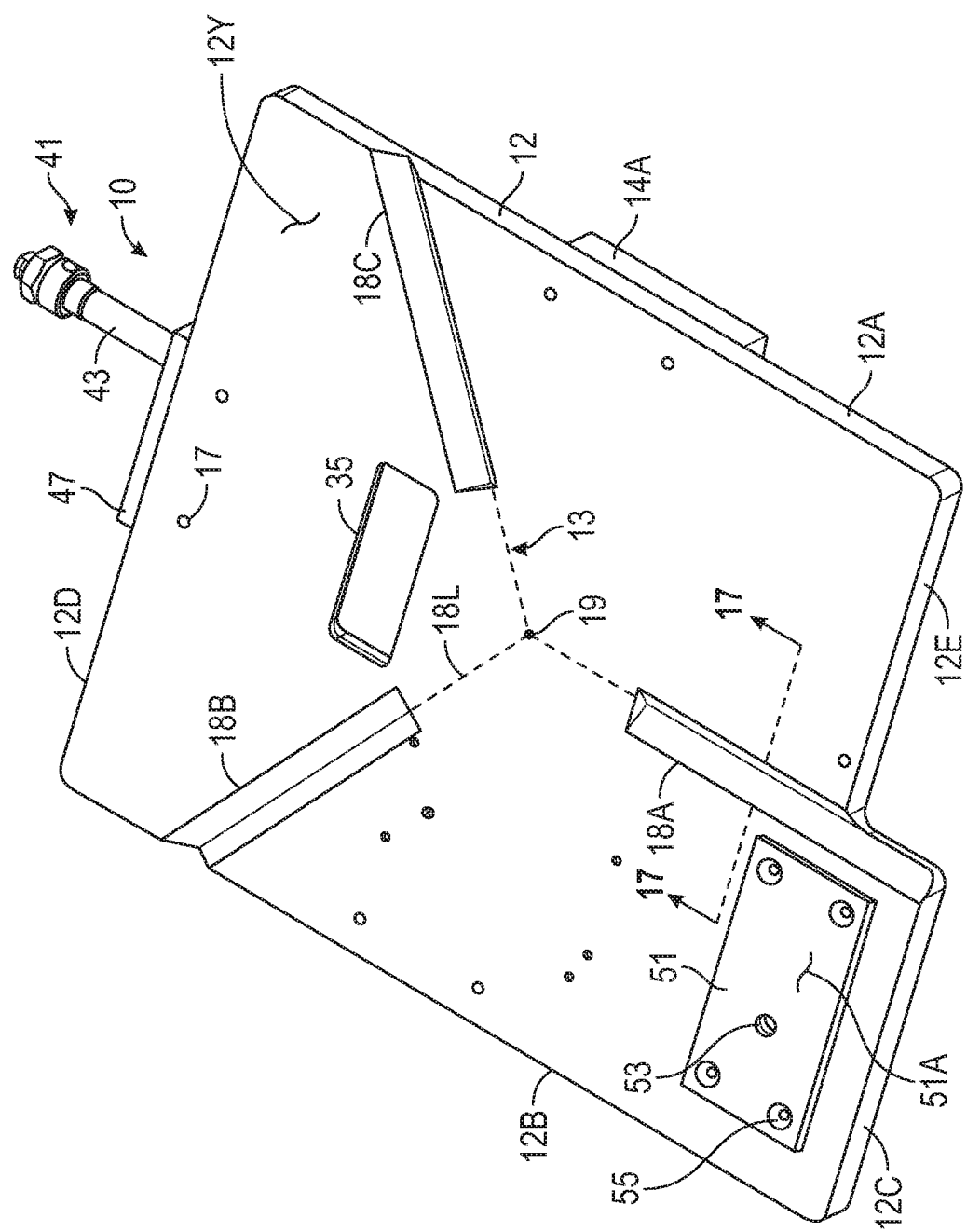
FIG. 2 is a bottom perspective view of one illustrative embodiment of a novel reticle pod conversion plate disclosed herein.
Figure 4:
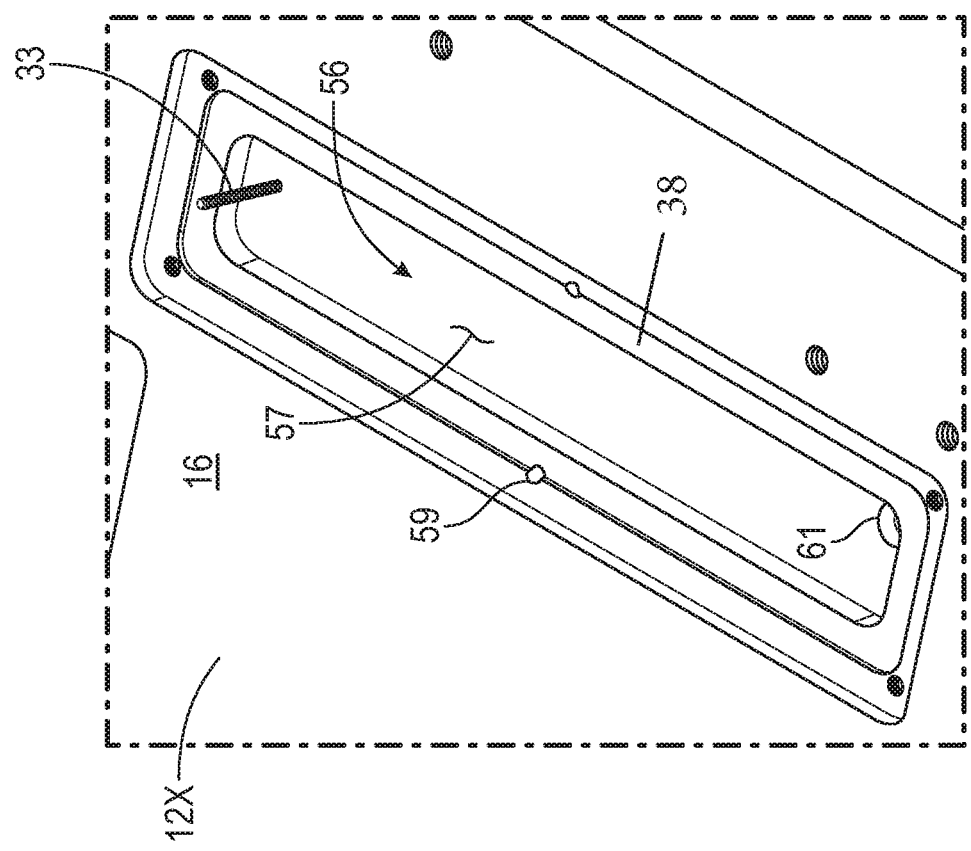
FIGS. 3 and 4 are views of a portion of the front surface of one illustrative embodiment of a novel reticle pod conversion plate disclosed herein depicting one illustrative embodiment of an air flow channel disclosed herein.
Figure 3:
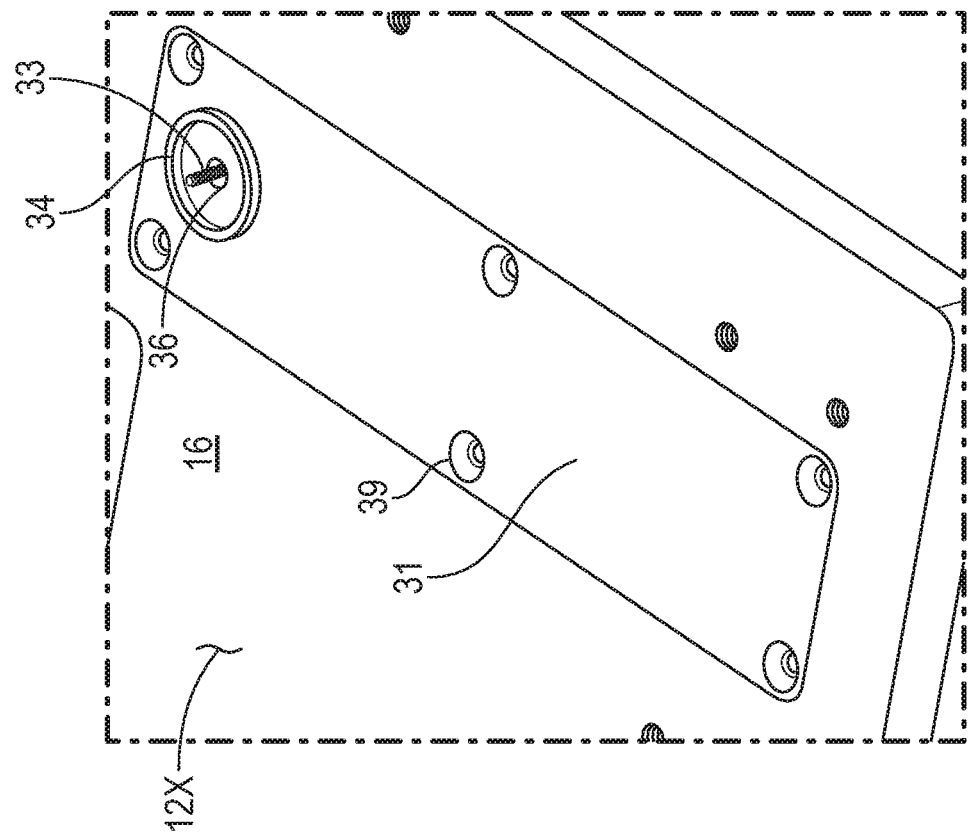
Figure 5:
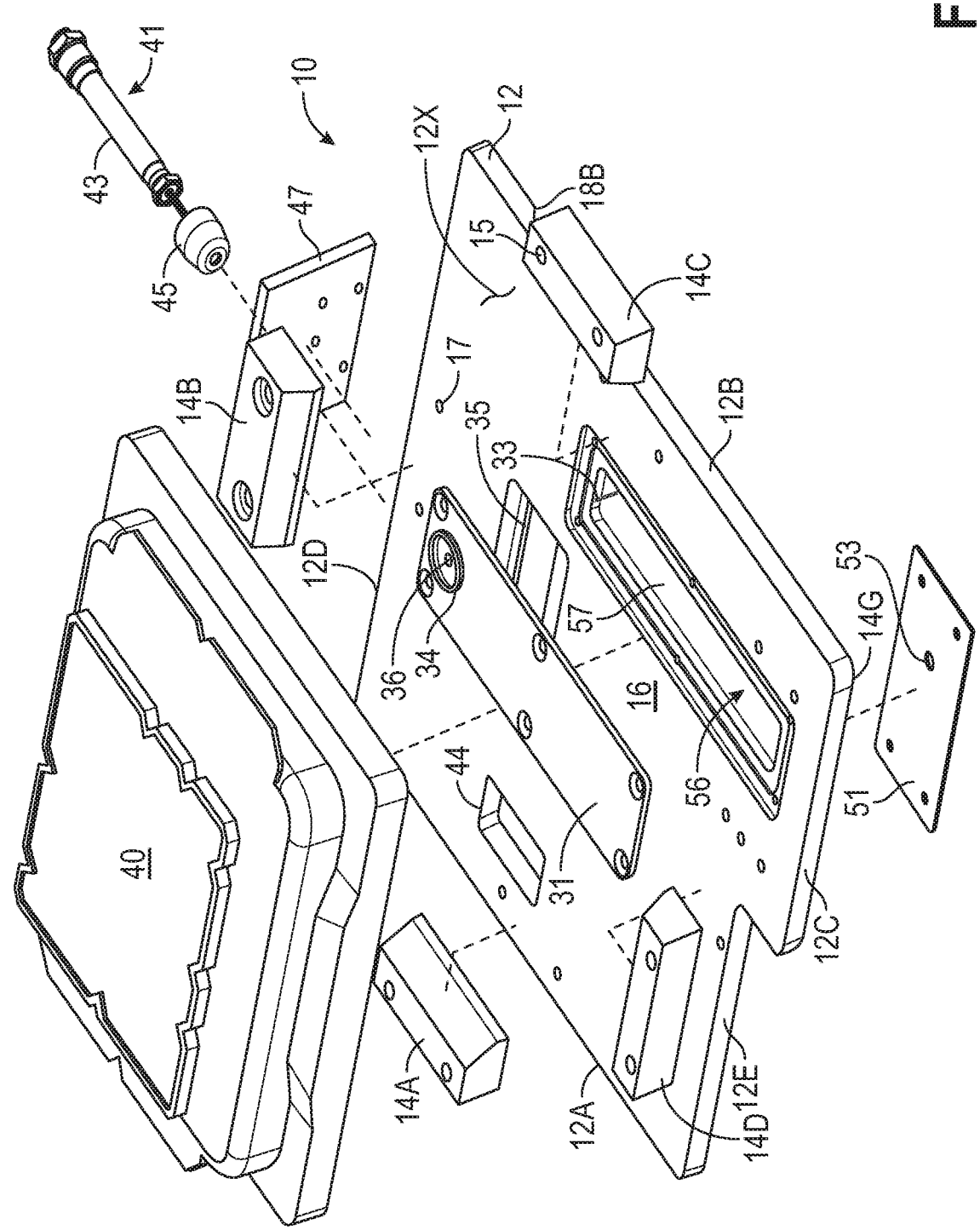
FIG. 5 is an exploded, top perspective view of one illustrative embodiment of a novel reticle pod conversion plate disclosed herein.
Figure 6:
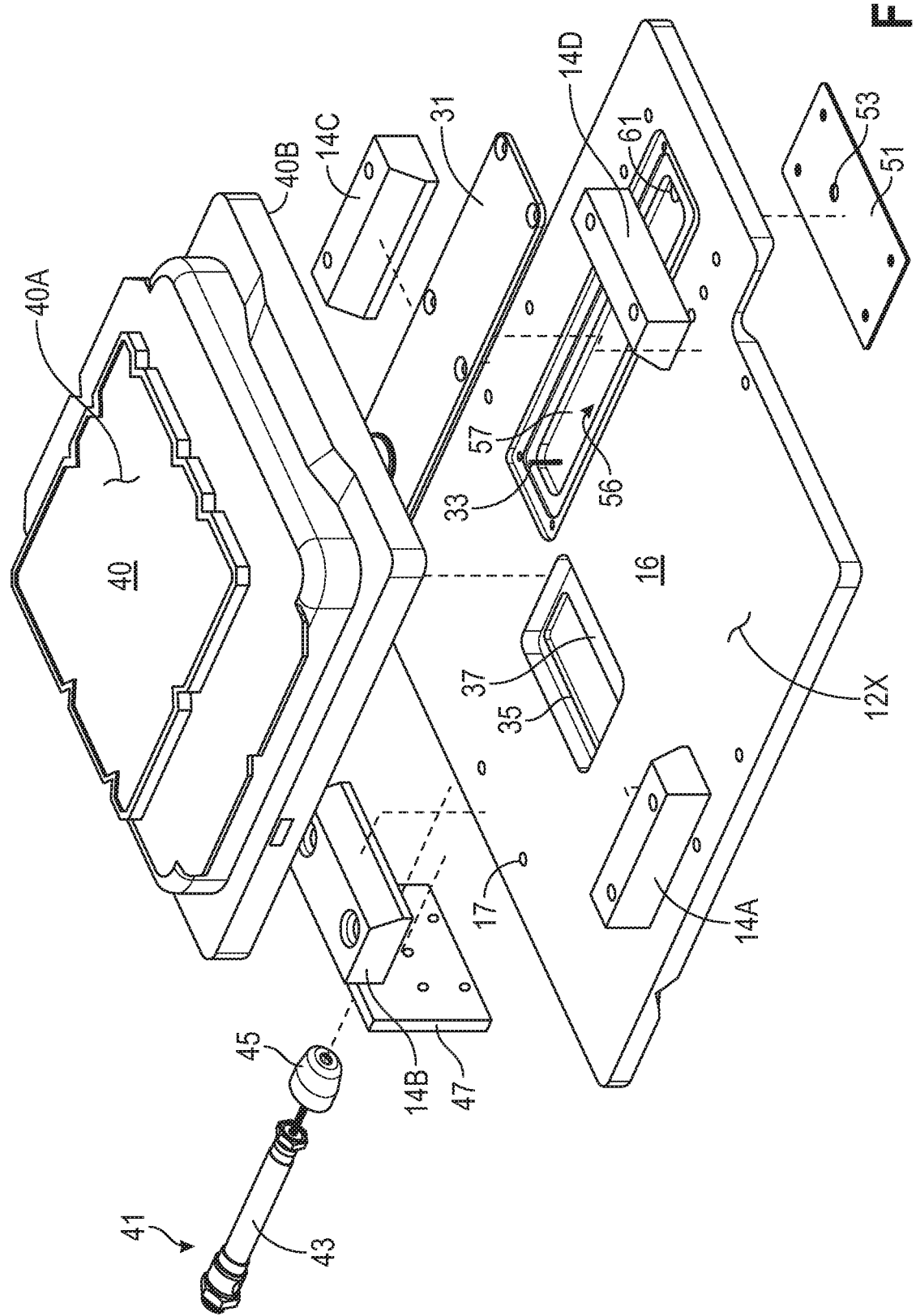
FIG. 6 is another exploded, top perspective view of one illustrative embodiment of a novel reticle pod conversion plate disclosed herein.

FIGS. 1-20 depict various views of various embodiments of a novel reticle pod conversion plate 10 disclosed herein for interfacing with a tool and various novel methods of using such a reticle pod conversion plate 10 to position a reticle pod 40 on a tool in a semiconductor manufacturing facility. FIGS. 1 and 2 are, respectively, top and bottom perspective views of one illustrative embodiment of a novel reticle pod conversion plate 10 disclosed herein.

In the depicted example, the reticle pod conversion plate 10 comprises a plate 12 and a plurality of reticle pod receiving guides 14A-D (collectively referenced using the numeral 14) that are secured to a front side 12X of the plate 12 by a plurality of threaded fasteners that extend through a plurality of openings 15 that extend through the reticle pod receiving guides 14 and a plurality of openings 17 that extend through the plate 12 (see FIG. 2). The plate 12 further comprises a side edge 12A, a side edge 12B, a back edge 12D, a first front edge 12C and a second front edge 12E. Collectively, the reticle pod receiving guides 14 define a reticle pod receiving area 16 on the front surface 12X of the plate 12. In general, the reticle pod receiving guides 14, considered collectively, constitute a means for receiving a reticle pod in a reticle pod receiving structure 16 on the front surface 12X of the plate 12. The plate 12 may be of any desired shape or configuration (when viewed from above) and it may be made of any material, e.g., aluminum, steel, plastic, etc. The plate 12 could also be made of multiple materials. As but one example, the body of the plate 12 could be a single injection molded piece of material with steel inserts that function as channels 18A-18C, collectively referenced as channels 18. As another alternative, the plate 12 could be manufactured with various pieces of bent sheet metal. Other possibilities will be recognized by those skilled in the art after a complete reading of the present application. The thickness of the plate 12 may also vary depending upon the particular application.

Figure 16:
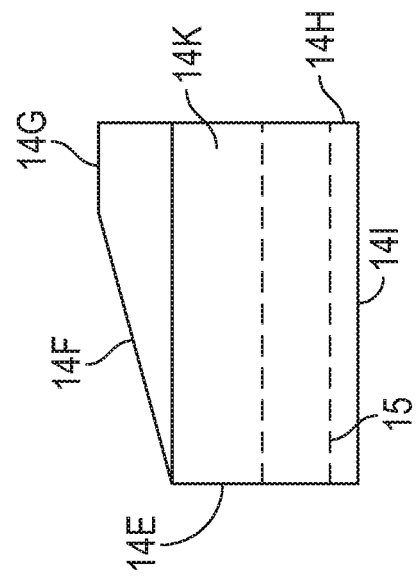
FIG. 16 is a side view of one illustrative embodiment of a reticle pod guide structure employed on one illustrative embodiment of a novel reticle pod conversion plate disclosed herein.
Figure 14:
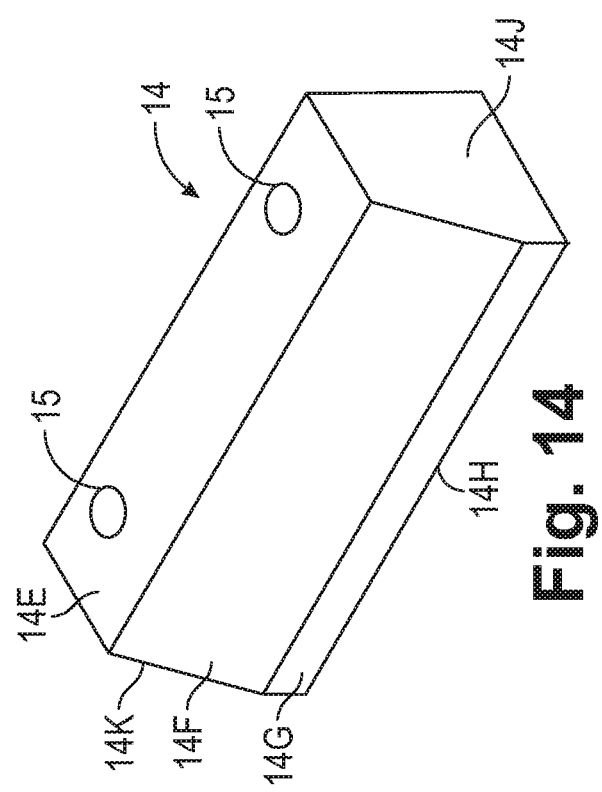
FIG. 14 is a perspective view of one illustrative embodiment of a reticle pod guide structure employed on one illustrative embodiment of a novel reticle pod conversion plate disclosed herein.
Figure 15:
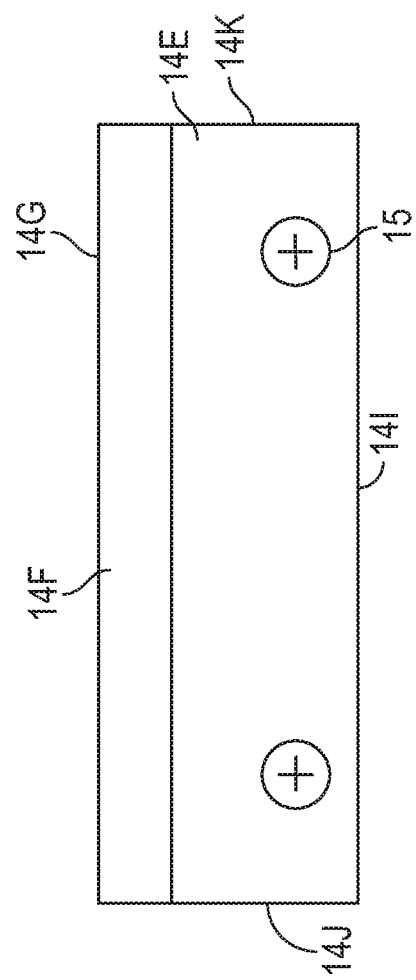
FIG. 15 is a top view of one illustrative embodiment of a reticle pod guide structure employed on one illustrative embodiment of a novel reticle pod conversion plate disclosed herein.
Figure 18:
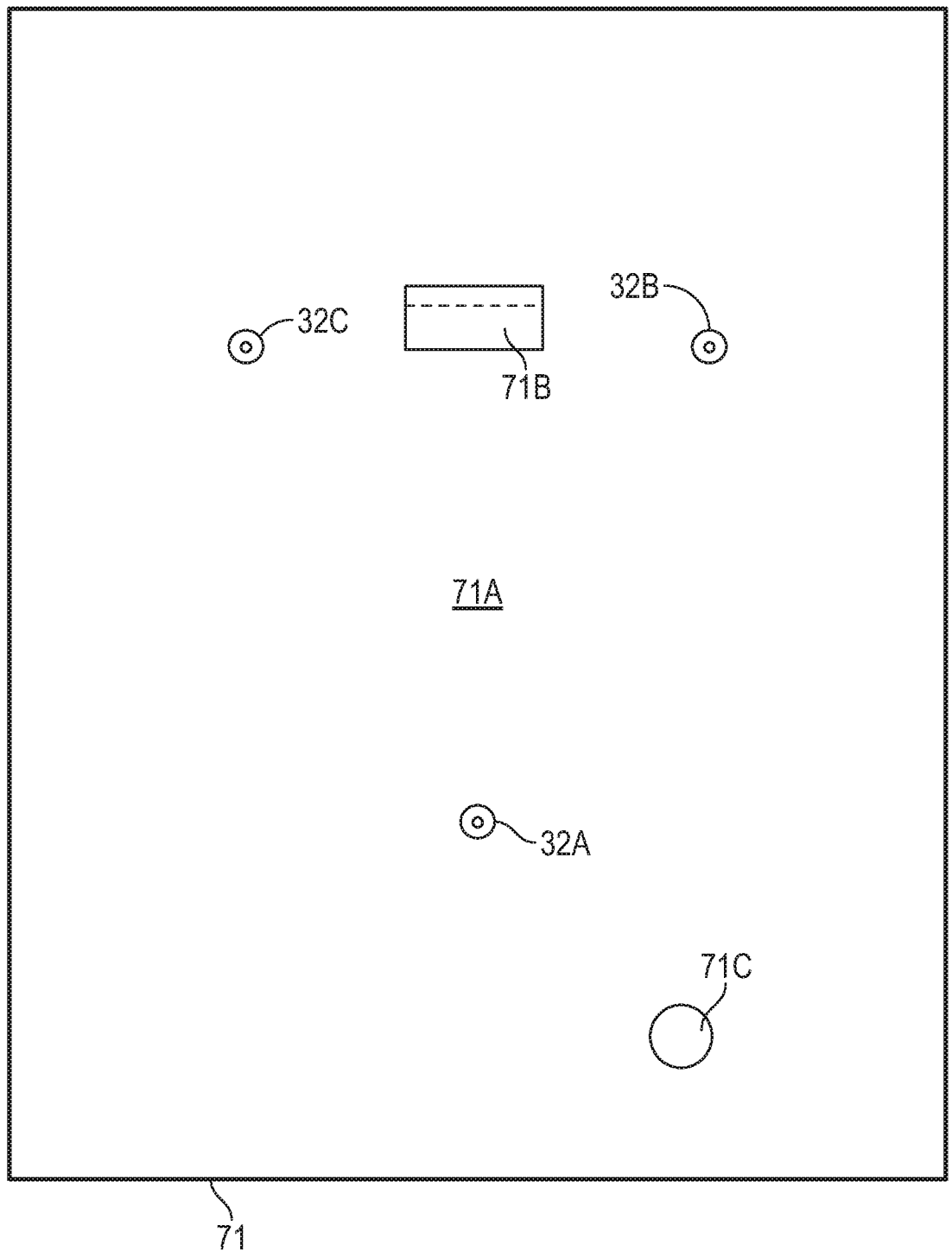
FIG. 18 is a top view of one illustrative embodiment of an illustrative tool that may be employed with the various embodiments of the novel reticle pod conversion plate disclosed herein.

As best seen in FIGS. 14-16, the illustrative reticle pod receiving guides 14 disclosed herein comprise a top surface 14E, a tapered front surface 14F, a vertical front surface 14G, a bottom surface 14H, a back surface 14I and end surfaces 14J, 14K. In the depicted example, the reticle pod receiving guides 14 are mounted on the plate 12 such that the tapered front surface 14F of each of the reticle pod receiving guides 14 faces inward toward the reticle pod receiving area 16. The illustrative embodiment of the individual reticle pod receiving guides 14 depicted in the drawings do not connect with one another.

Of course, as will be appreciated by those skilled in the art after a complete reading of the present application, the four illustrative reticle pod receiving guides 14 are only one possible arrangement of a means for receiving a reticle pod in a reticle pod receiving structure 16 on the front surface 12X of the plate 12. In other embodiments, less than four of the reticle pod receiving guides 14 may be provided, e.g., the reticle pod conversion plate 10 may comprise only three of the reticle pod receiving guides 14. In the depicted example, the reticle pod receiving guides 14 are individual structures that are removably coupled to the plate 12. In other applications, the reticle pod receiving guides 14 may be formed integral with the plate 12, e.g., by machining the reticle pod receiving guides 14 into the material of the plate 12 or by casting the reticle pod receiving guides 14 and the plate 12 as a single body of material. In yet other applications, the individual reticle pod receiving guides 14 may be attached to the plate 12 by welding or gluing them into position on the plate 12. Additionally, in yet other embodiments, the individual reticle pod receiving guides 14 may be replaced with a continuous ring of material, e.g., a rectangular-shape ring of material, that completely bounds the reticle pod receiving area 16. Such a continuous reticle pod receiving ring may be permanently or removably coupled to the plate 12, or it may be formed integral with the plate 12, and it may comprise a tapered surface 14F that faces the reticle pod receiving area 16. The reticle pod receiving guides 14 may be of any desired shape or configuration (when viewed from above) and they may be made of any material, e.g., aluminum, steel, plastic, etc. The vertical thickness or height of the reticle pod receiving guides 14 may also vary depending upon the particular application. Moreover, the reticle pod receiving guides 14 and the plate 12 need not be made of the same material, but that may be the case in some applications. In another embodiment, the individual reticle pod receiving guides 14 may be positioned on one or more adjustable slides to allow for adjustable positioning of the reticle pod receiving guides 14 so as to adjust the size of the reticle pod receiving area 16. In some embodiments, the reticle pod receiving guides 14 may even be omitted entirely or raised surfaces (not shown) formed in or on the front surface 12X of the plate 12 may be provided to serve the functions of the reticle pod receiving guides 14 and/or to prevent the reticle pod from sliding off of the plate 12.

The reticle pod receiving area 16 may be sized and configured to receive a reticle pod of any size or configuration. For example, the reticle pod receiving area 16 may be sized and configured to receive, for example, 150 mm SMIF (Standard Mechanical InterFace), 200 mm SMIF, EUV reticle pods, etc. In one illustrative embodiment where the reticle pod receiving guides 14 are removably coupled to the plate 12, additional mounting holes 17 (see FIG. 2) may be formed in the plate 12 to allow for positioning the reticle pod receiving guides 14 at different locations such that the reticle pod receiving area 16 is properly sized to receive a reticle pod having a specific size and/or configuration.

The vertical height of the reticle pod 40 relative to the vertical height of the reticle pod receiving guides 14 may vary depending upon the particular application, i.e., the vertical height of the reticle pod 40 may be less than, greater than or substantially the same as the vertical height of the reticle pod receiving guides 14. In the example depicted herein, the vertical height of the reticle pod 40 is greater than the vertical height of the reticle pod receiving guides 14.

Figure 7:
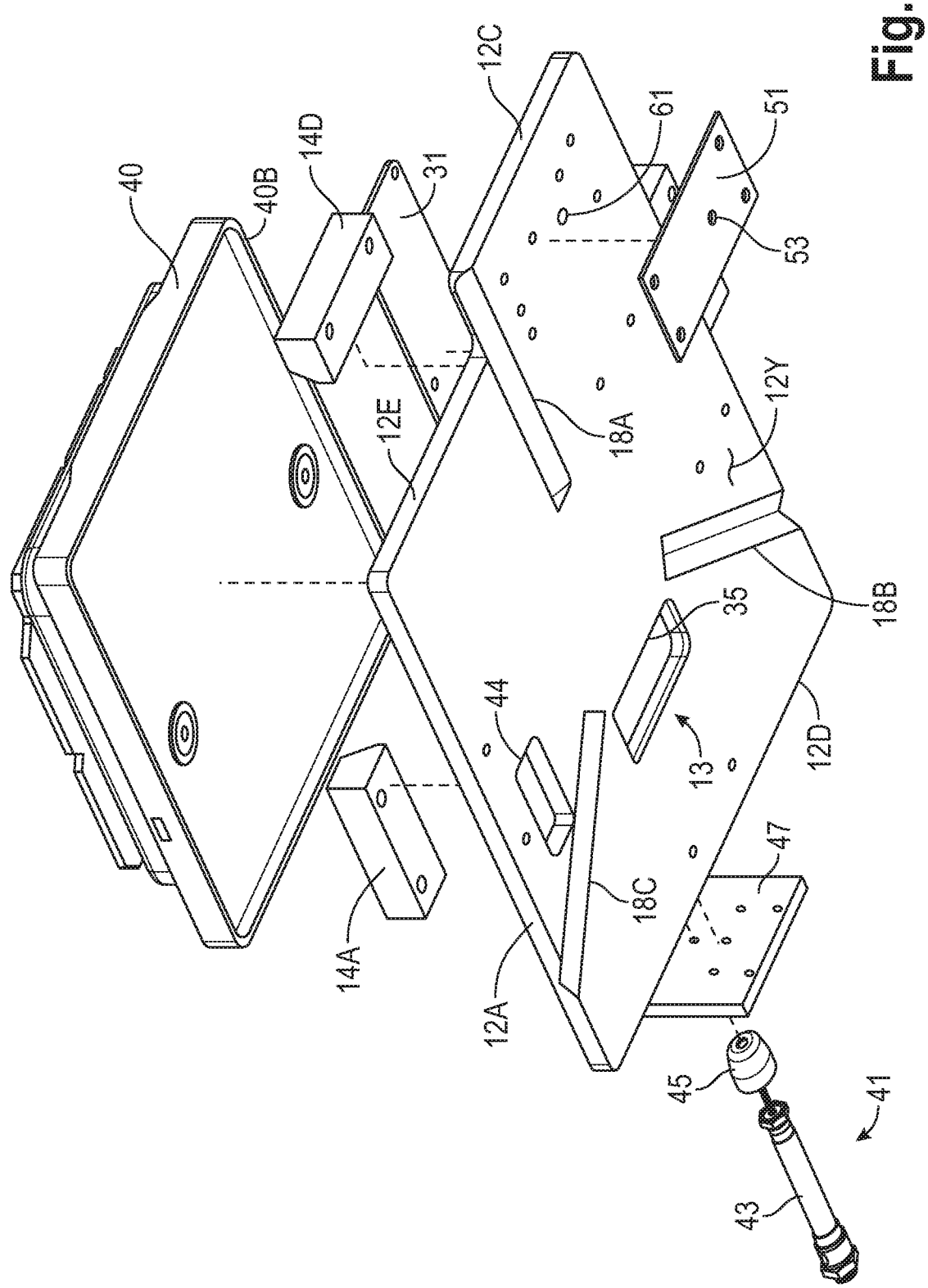
FIG. 7 is an exploded, bottom perspective view of one illustrative embodiment of a novel reticle pod conversion plate disclosed herein.
Figure 8:
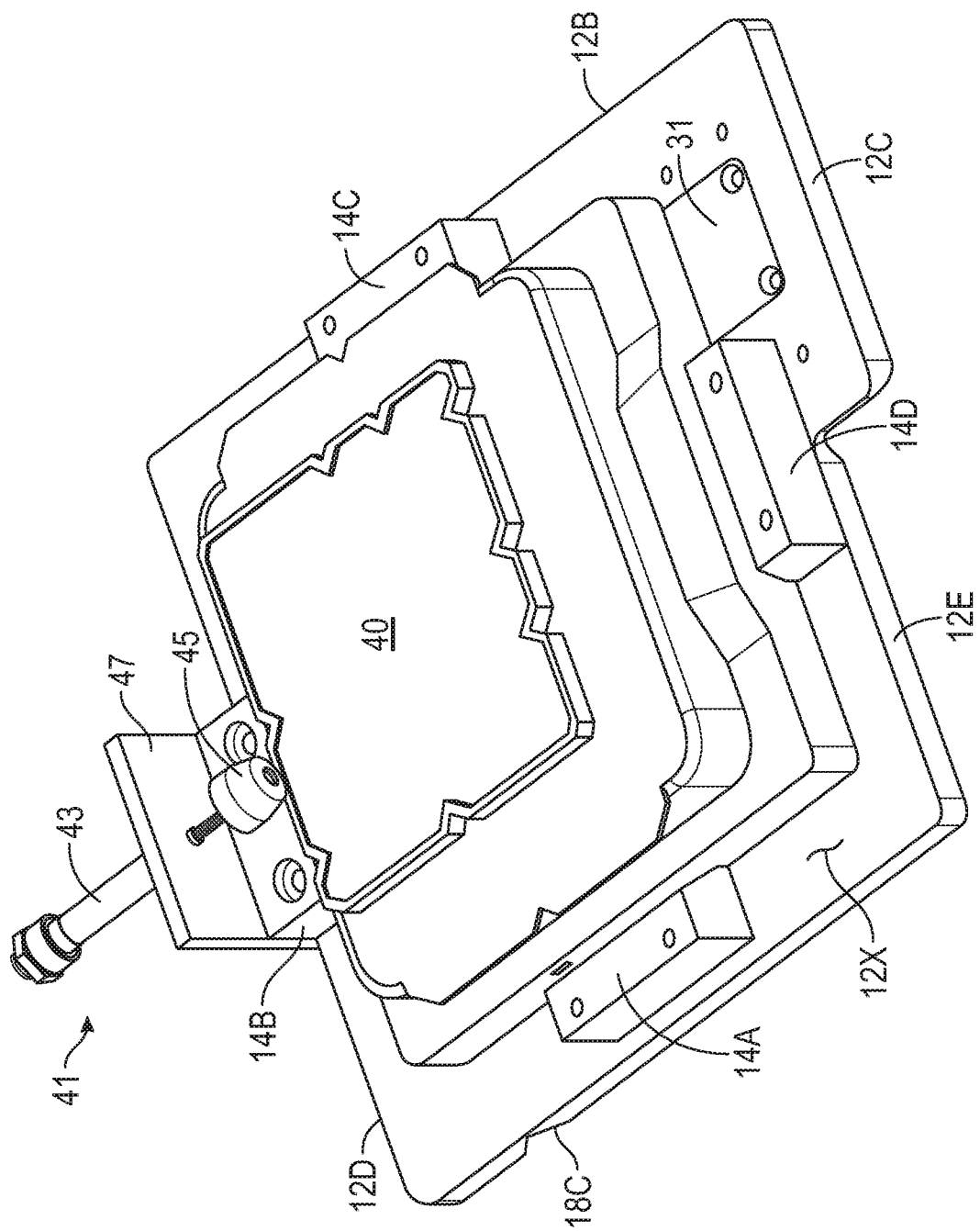
FIG. 8 is a top perspective view of one illustrative embodiment of a novel reticle pod conversion plate disclosed herein with an illustrative reticle pod positioned thereon.
Figure 9:
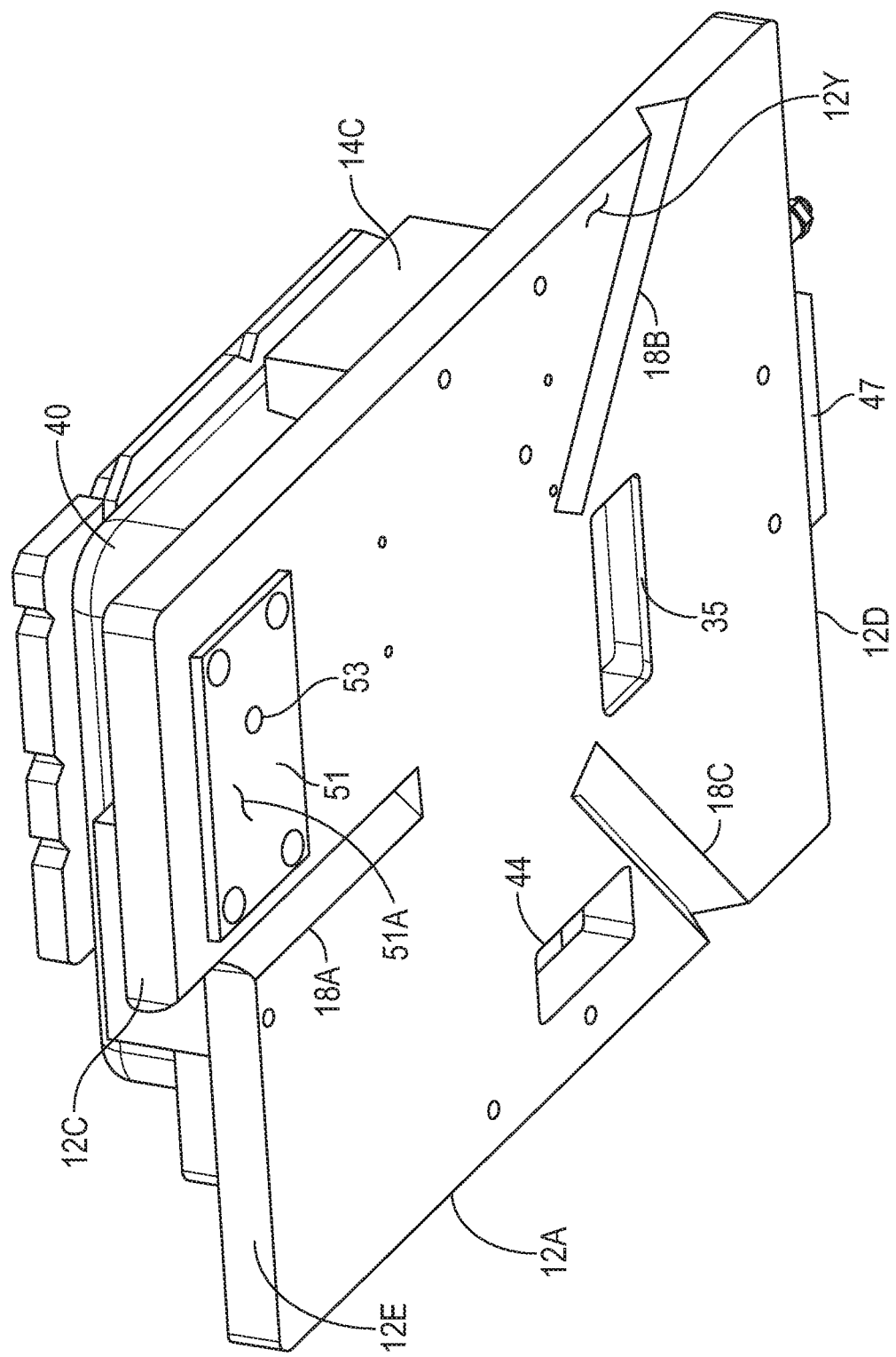
FIG. 9 is a bottom perspective view of one illustrative embodiment of a novel reticle pod conversion plate disclosed herein with an illustrative reticle pod positioned thereon.
Figure 10:
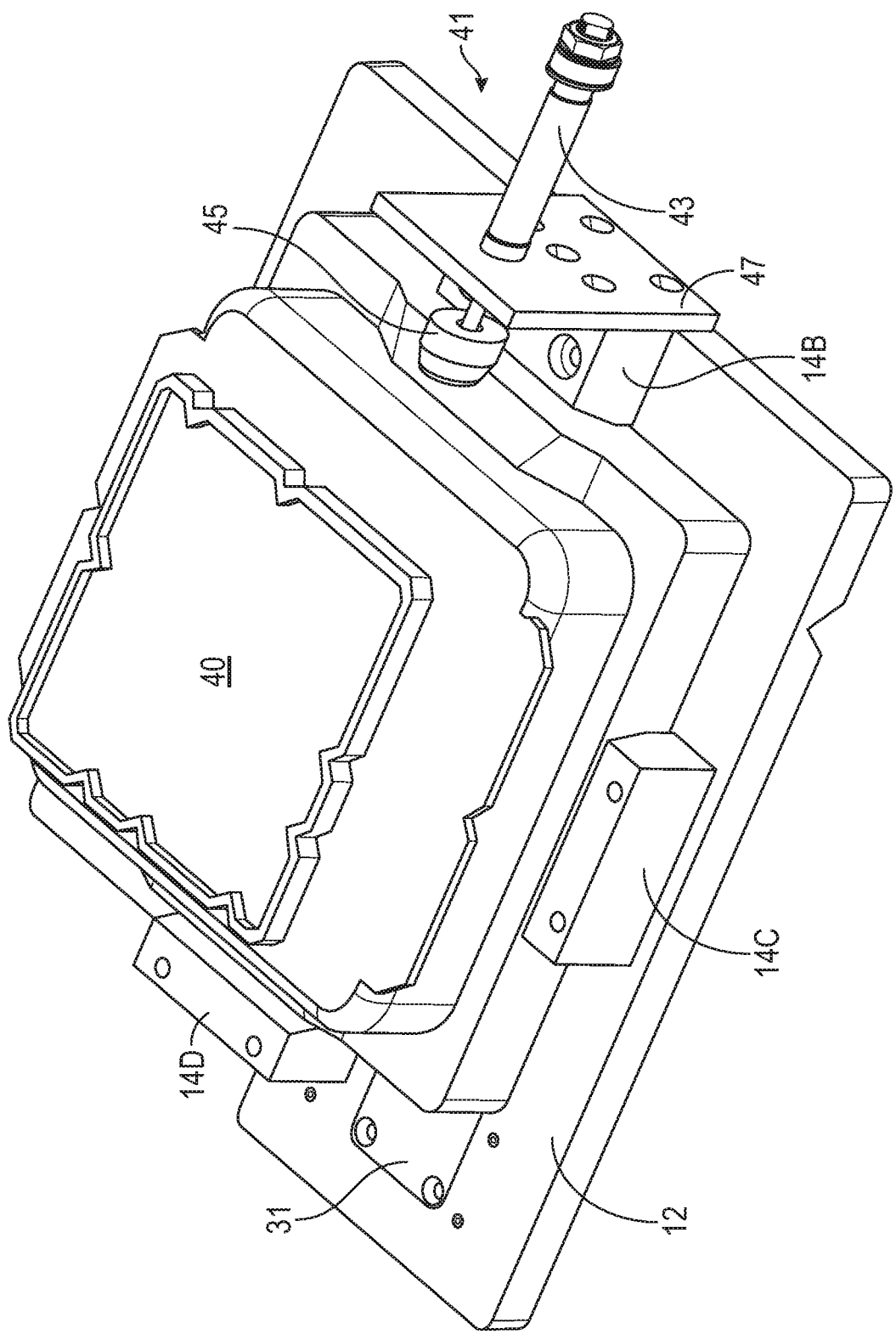
FIG. 10 is another top perspective view of one illustrative embodiment of a novel reticle pod conversion plate disclosed herein with an illustrative reticle pod positioned thereon.

With reference to FIGS. 2 and 7, a pin engagement structure 13 is formed in the back surface 12Y of the plate 12. The pin engagement structure 13 is adapted to engage with a plurality of pins 32A-C (collectively referenced using the numeral 32)—see FIG. 18—that are positioned on a surface 71A of an illustrative tool 71 when the reticle pod conversion plate 10 is positioned on the tool 71. In the depicted example, the pins 32 are positioned on an upper surface of the tool 71. In one illustrative embodiment, the pins 32 may be SEMI standard (E57) load port pins.

The pin engagement structure 13 on the bottom surface 12Y of the plate 12 is, in effect, a means for engaging the pins 32 positioned on the surface 71A of the tool 71. In the depicted example, the pin engagement structure 13 takes the form of a plurality of channels 18A-C (collectively referenced using the numeral 18) that are formed in the back surface 12Y of the plate 12. Each of the channels 18 is adapted to engage and register with one of the pins 32 when the reticle pod conversion plate 10 is positioned on the tool 71. In the depicted example, the channels are formed such that the opening of each of the channels 18 is substantially coplanar with the back surface 12Y of the plate 12, however, that may not be the case in all applications. With reference to FIG. 2, note that, in the illustrative embodiment depicted herein, the channel 18A intersects the front surface 12C and the front surface 12E, the channel 18B intersects the side edge 12B and the channel 18C intersects the side edge 12A. Also note that the back surface 12D is not intersected by any of the channels 18. Of course, the reticle pod conversion plate 10 could be manufactured in such a way that the channels 18 do not intersect any of the side edges of the reticle pod conversion plate 10. Lastly, in the example depicted herein, the reticle pod conversion plate 10 was provided with a notched front surface (i.e., the surfaces 12C and 12E) so as to reduce the weight of the reticle pod conversion plate 10. In other applications, the notched surface may be omitted and the surface 12E may extend all the way across the front of the reticle pod conversion plate 10.

Figure 17:
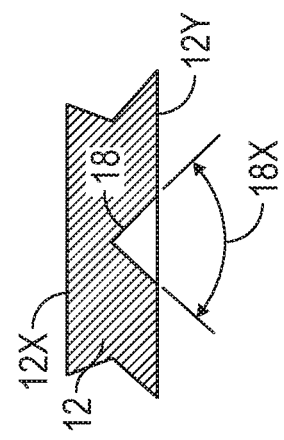
FIG. 17 is a cross-sectional view of one possible configuration for the channels disclosed herein.

The pin engagement structure 13 (e.g., the channels 18) are sized, positioned and configured to engage and register with the pattern of the pins 32 on any tool 71 in a semiconductor manufacturing facility. The number and positioning of the channels 18 in the back surface 12Y may vary depending upon the particular application. In the depicted example, the channels 18 are separate from one another, although that may not be the case in all applications. FIG. 17 is a cross-sectional view of one possible configuration for the channels 18. Of course, the presently disclosed subject matter should not be considered to be limited to uses of the via interaction between the pin engagement structure 13 and the plurality of SEMI standard load port pins 32, as other possible means of engagement and registration between the two structures may be employed.

In the illustrative example depicted herein, the three channels 18 do not physically intersect one another. Moreover, with reference to FIG. 2, each of the channels have a long axis 18L, wherein an extension of the long axis of the axes 18L intersect one another at a point 19 below the reticle pod receiving area 16. Additionally, when viewed from above, the radial spacing between the first channel 18A and the second channel 18B is approximately 120 degrees, the radial spacing between the second channel 18B and the third channel 18C is approximately 120 degrees and the radial spacing between the third channel 18C and the first channel 18A is approximately 120 degrees.

The reticle pod conversion plate 10 also comprises a first recess 30 with an upper surface that is substantially coplanar with the front surface 12X of the plate 12. The first recess 30 also comprises an opening 35 that extends through the plate 12 and an engagement surface 37 adjacent the opening 35. A plate securement mechanism 71B (described below) on the tool 71 is adapted to extend through the opening 35 and, when actuated, to engage the engagement surface 37 to secure the reticle pod conversion plate 10 to the tool 71. In the depicted example, the engagement surface 37 is positioned at a level that is below the level of the front surface 12X of the plate 12. The plate securement mechanism 71B on the tool 71 may be any of a variety of different securement mechanisms known to those skilled in the art, and it may be actuated in any manner, e.g., mechanically, electrically, hydraulically, pneumatically, etc. In other applications, the opening 35 may be omitted and the reticle pod conversion plate 10 may be secured in position on the tool 71 by a suction mechanism on the tool 71 that engages the back surface 12Y of the plate 12. In yet other applications, the opening 35 may be omitted and the plate securement mechanism 71B on the tool 71 may simply engage one or more portions of the front surface 12X of the plate 12. Other possible variations and mechanisms for the plate securement mechanism 71B will be recognized by those skilled in the art after a complete reading of the present application.

In the depicted example, the reticle pod conversion plate 10 also comprises a reticle pod securement mechanism 41 that, when actuated, is adapted to secure a reticle pod 40 in the reticle pod receiving area 16. The reticle pod securement mechanism 41 may not be present in all embodiments of the reticle pod conversion plate 10. In the depicted example, the reticle pod securement mechanism 41 comprises tubing 43 and a pod engagement structure 45. When the reticle pod securement mechanism 41 is actuated, the pod engagement structure 45 is adapted to engage a surface of the reticle pod 40 to maintain the position of the reticle pod 40 in the reticle pod receiving area 16. The reticle pod securement mechanism 41 is operatively coupled to the reticle pod conversion plate 10 via bracket 47 that is coupled to the back surface 12D of the reticle pod conversion plate 10 and the reticle pod receiving guide 14B by a plurality of screws. The reticle pod securement mechanism 41 may be any of a variety of different mechanisms known to those skilled in the art that can be used to engage a surface of the reticle pod 40, and it may be actuated in any manner, e.g., mechanically, electrically, hydraulically, pneumatically, etc. In one particular example, the reticle pod securement mechanism 41 may be a pneumatically actuated mechanism whereby pressurized air is supplied via the tubing 43 to the pod engagement structure 45 until such time as it engages a surface of the reticle pod 40. Pressure is maintained within the tubing 43 for as long as necessary. The pod engagement structure 45 can be retracted by applying a negative pressure in the tubing 43 or via a spring-assisted return mechanism.

The illustrative embodiment of the reticle pod conversion plate 10 depicted herein also includes a first cover plate 31 that covers a fluid flow channel 56 formed at least partially on, in or within the plate 12 or positioned in close proximity to the plate 12. As will be appreciated by those skilled in the art after a complete reading of the present application, the fluid flow channel 56 is adapted to allow fluid communication with an interior region of the reticle pod 40 when the reticle pod 40 is positioned in the reticle pod receiving area 16. In the depicted example, the fluid flow channel 56 comprises a second recess 56 formed in the plate 12 that is partially defined by a bottom surface 57. The first cover plate 31 may be secured to the plate 12 by a plurality of screws (not shown) that extend through the openings 39 in the first cover plate 31 and engage threaded openings 59 in the plate 12. A gasket (not shown) may be positioned between the first cover plate 31 and a gasket surface 38 adjacent the fluid flow channel 56. The fluid flow channel 56 is in fluid communication with an opening 61 that extends through the bottom surface 57 of the recess and through the back surface 12Y of the plate 12. As will be appreciated by those skilled in art after a complete reading of the present application, the structure and configuration of the fluid flow channel 56 depicted herein is by way of example only as it may take a variety of different forms, structures and configurations, e.g., it may comprise any form of fluid flow device or structure that will provide a fluid flow path between the reticle pod 40 and the tool 71, as described more fully below. For example, in the example depicted herein, at least a portion of the fluid flow channel is positioned within the plate 12. In other embodiments, the fluid flow channel 56 may comprise a fluid flow conduit, e.g., plastic tubing, metal tubing and/or pipe, at least some portion of which is mechanically supported by some portion of the plate 12 either directly (i.e., by direct physical contact between the fluid flow conduit and the plate 12) or indirectly (by use of one or more intermediate structures positioned between some portion of the fluid flow conduit and the plate 12). For example, at least some portion of the fluid flow channel 56 may be positioned within the plate 12, on or above the front surface 12X of the plate 12, on or above the back surface 12Y of the plate 12, or some combination thereof. Thus, the presently disclosed inventions should not be considered to be limited to the illustrative embodiment of the fluid flow channel 56 described herein.

Also depicted is an illustrative pin 33 the extends through an opening 36 in the first cover plate 31. As will be described more fully below, the pin 33 is adapted to engage and open a check valve in the reticle pod 40 when the reticle pod 40 is positioned in the reticle pod receiving area 16. A gasket 34 is positioned around the pin 33 and above an upper surface of the first cover plate 31. The pin 33 has an uppermost portion that is positioned at a level that is above a level of the upper surface of the first cover plate 31. In the depicted example, only a single pin 33 is used. However, in other applications, two of the pins 33 may be used to engage both of the check valves that are present in the reticle pod 40.

Also depicted in this particular example, the reticle pod conversion plate 10 comprises a second cover plate 51, with a surface 51A, that is secured to the back surface 12Y of the plate 12 by a plurality of screws (not shown) that extend though openings 55 in the second cover plate 51 and engage threaded openings (not shown) in the plate 12. The second cover plate 51 comprises an opening 53 that extends through the second cover plate 51. The opening 53 is in fluid communication with the opening 61 and, via the opening 61, in fluid communication with the fluid flow channel 56 and the opening 36 in the first cover plate 31. A gasket (not shown) is positioned between the second cover plate 51 and the back surface 12Y of the plate 12. As will be discussed more fully bellow, a suction mechanism 71C on the tool 71 is adapted to be extended so as to sealingly engage the surface MA of the second cover plate 51. As will be appreciated by those skilled in the art after a complete reading of the present application, the second cover plate 51 is a spacer plate that is sized such that, when the reticle pod conversion plate 10 is positioned on the tool 71, the surface 51A will be a height level that corresponds to a height level of a sampling port surface of a FOUP (Front Opening Unified Pod), were a FOUP positioned on the tool 71. Thus, the thickness of the second cover plate 51 may vary depending upon the particular application. In some applications, the second cover plate 51 may be omitted. For example, the plate 12 could be made sufficiently thick such that the back surface 12Y of the plate 12 is positioned at a height level that corresponds to the height level of a sampling port surface of a FOUP. In this latter situation, when the suction mechanism 71C of the tool 71 is extended, it would engage the back surface 12Y of the plate 12.

In one illustrative embodiment, the reticle pod conversion plate 10 may also comprise an opening 44 that permits an RFID reader (not shown) to read an identification number of the reticle pod 40 positioned on the reticle pod conversion plate 10. So as not to overly complicate the drawings, the opening 44 is only shown in FIGS. 5, 7 and 9. The RFID reader may be secured to the reticle pod conversion plate 10 using any of a variety of known techniques. As is known by those skilled in the art, RFID readers vary in size and shape. Thus, the opening 44 may be of any size, shape or configuration that accommodates the particular RFID reader employed with the reticle pod conversion plate 10. Additionally, the opening 44 may be positioned at virtually any desired location on the plate 12. In some applications, a portion of the opening 44 may extend under one of the reticle pod receiving guides 14.

As noted above, FIG. 18 is a top view of one illustrative embodiment of a tool 71 that the various embodiments of the reticle pod conversion plate 10 disclosed herein may engage. In the depicted example, a plurality pins 32A-C (collectively referenced using the numeral 32) are positioned on a surface 71A of the tool 71. In one particular example, the pins 32 are a plurality of SEMI standard load port pins that comply with SEMI standard E57 and the surface 71A is an upper surface of the tool 71. The tool 71 also comprises a plate securement mechanism 71B. When actuated, a portion of the plate securement mechanism 71B is adapted to extend through the opening 35 in the plate 12 and engage the engagement surface 37 so as to secure the reticle pod conversion plate 10 in position on the tool 71. The plate securement mechanism 71B may be omitted in some applications. The plate securement mechanism 71B be of any form, type or nature and it may be comprised of any of a variety of mechanisms known to those skilled in the art, e.g., mechanisms that include one or more motors (pneumatic or electrical) and various mechanical linkages, etc. The tool 71 further comprises a suction mechanism 71C that, as discussed more fully below, is adapted to engage the surface 51A of the second cover plate 51 so as to provide fluid communication between the tool 71 and an interior region of a reticle pod 40 that will be positioned on the reticle pod conversion plate 10 which, in turn, will be positioned on the tool 71.

As is known to those skilled in the art, some form or type of placement and presence sensors (not shown) will be positioned in the load port of the tool 71. The placement and presence sensors are the means by which the tool 71 recognizes when a carrier or object—in this case the reticle pod conversion plate 10 and the reticle pod 40—have been positioned on the load port. The placement and pressure sensors come in a variety of forms, e.g., one or more pressure switches, one or more laser sensors, etc. In the case where the tool comprises a pressure switch, an opening (not shown), i.e., a mechanical pass through feature, would need to be added to the plate 12 so that when the reticle pod 40 lands on the tool 71 it activates the pressure switch on the tool 71. Similarly, in the case where the tool 71 comprises a laser sensor, an opening (not shown) would need to be formed in the plate 12 so that the receiver/reflector of the laser sensor are not blocked.

Figure 19:
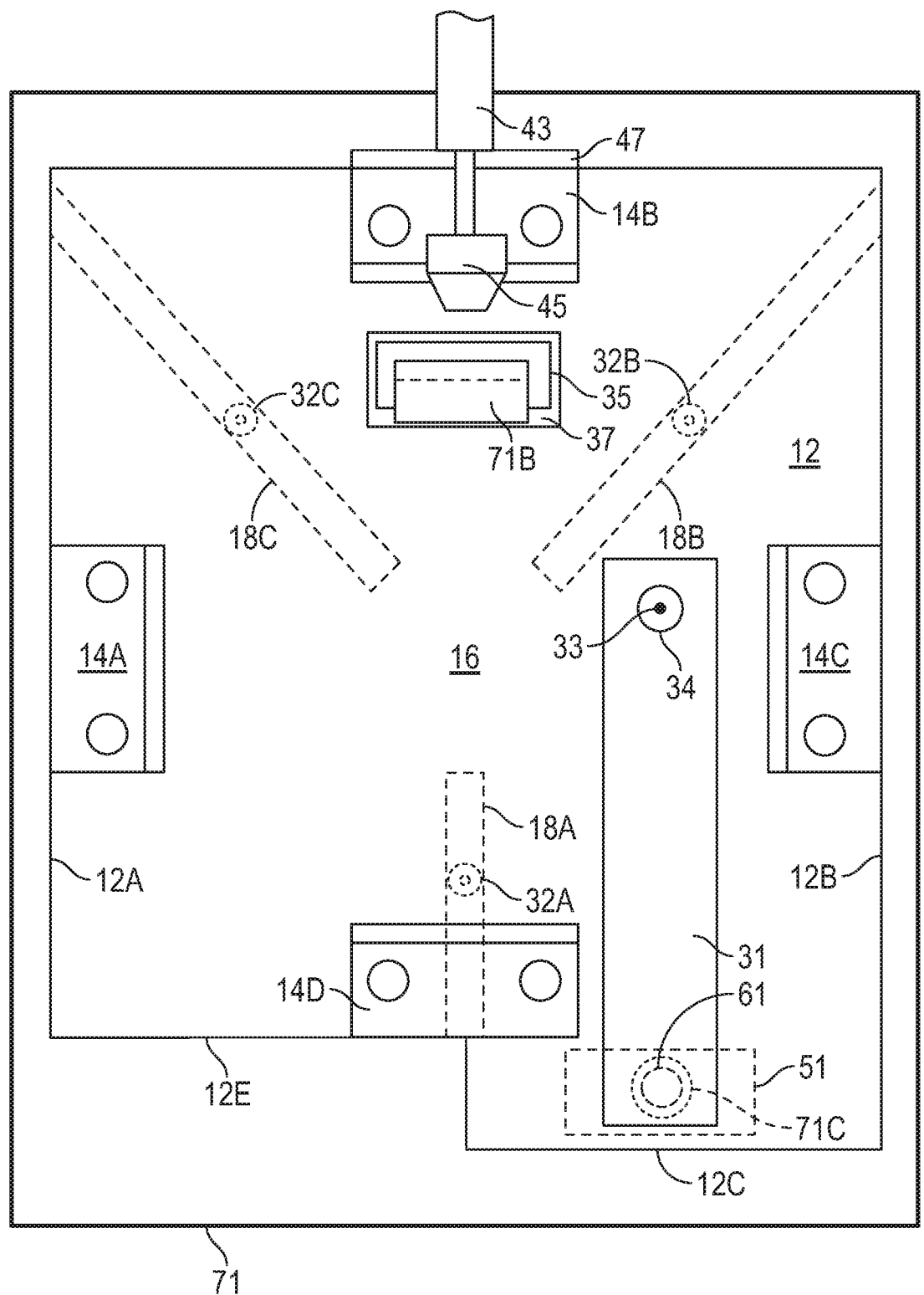
FIG. 19 is a top view showing one illustrative embodiment of a novel reticle pod conversion plate disclosed herein positioned on and above the upper surface of an illustrative tool.

As shown in FIG. 19, one illustrative embodiment of a novel reticle pod conversion plate 10 has been positioned on the tool 71. In practice, a reticle pod 40 may be positioned on the reticle pod conversion plate 10 prior to positioning the reticle pod conversion plate 10 on the tool 71. However, for ease of explanation, the reticle pod conversion plate 10 is depicted in FIG. 19 as being initially positioned on the tool 71 without a reticle pod 40 being positioned in the reticle pod receiving area 16 of the reticle pod conversion plate 10. As shown in FIG. 19, the pin engagement structure 13 (e.g., the channels 18) has engaged and registered with the plurality of pins 32 on the tool 71 so as to thereby fix the position of the reticle pod conversion plate 10 relative to the tool 71. As depicted, the plate securement mechanism 71B has been extended through the opening 35 in the reticle pod conversion plate 10 and it is in clamped engagement with the engagement surface 37, thereby securing the reticle pod conversion plate 10 in position on the tool 71.

Figure 20:
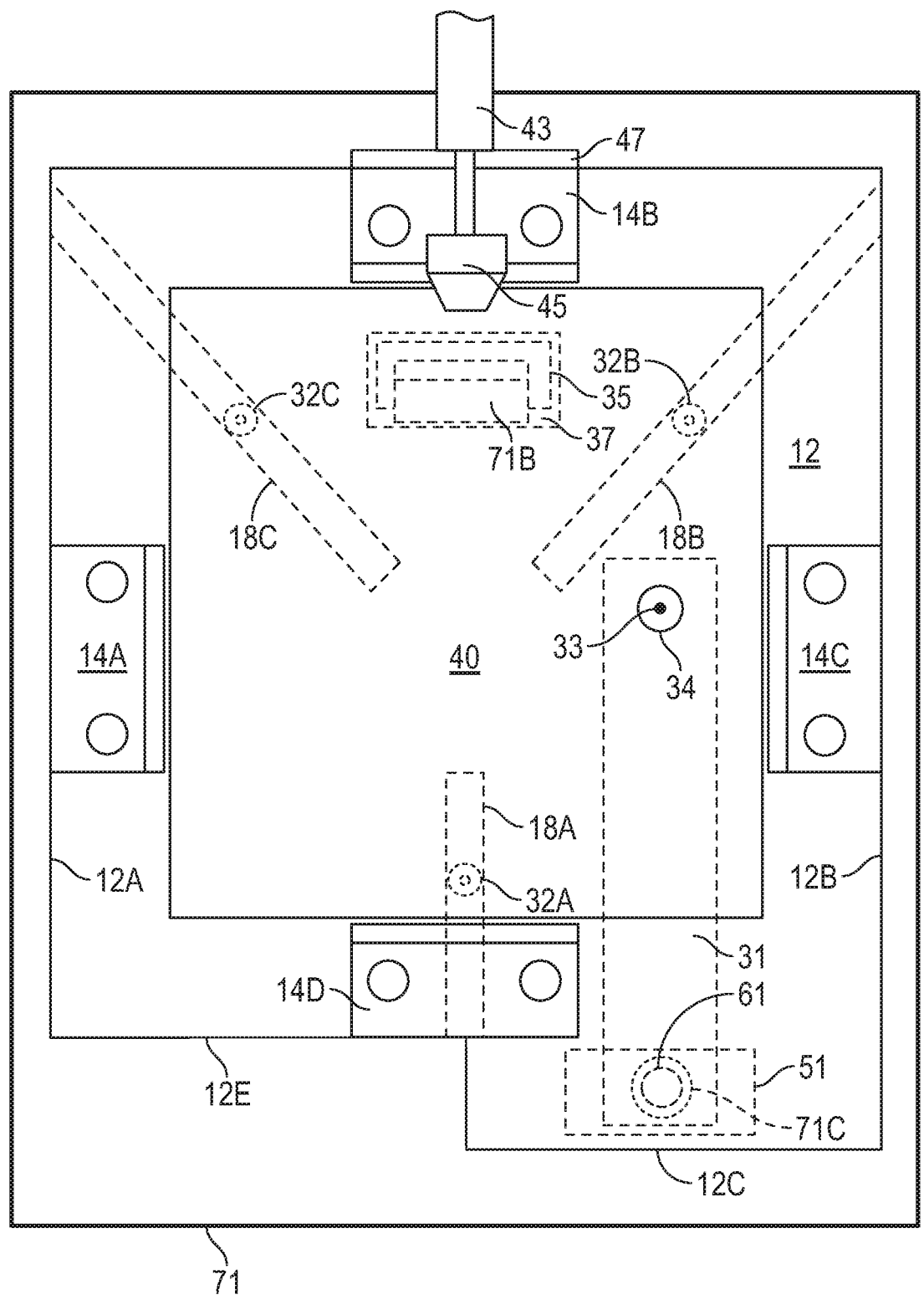
FIG. 20 is a top view showing one illustrative embodiment of a novel reticle pod positioned on the reticle pod conversion plate shown in FIG. 19.

FIG. 20 shows one illustrative embodiment of the reticle pod 40 positioned in the reticle pod receiving area 16 of one illustrative embodiment of a novel reticle pod conversion plate 10 disclosed herein. At this point, if present, the pod securement mechanism 41 may be actuated (if deemed necessary or desirable) so as to cause the pod engagement structure 45 to engage a surface of the reticle pod 40 to securely position the reticle pod 40 in the reticle pod receiving area 16 of the reticle pod conversion plate 10. In other applications, the reticle pod 40 may be positioned in the reticle pod receiving area 16 of the reticle pod conversion plate 10 prior to positioning the combination of the reticle pod conversion plate 10 and the reticle pod 40 on the tool 71. In this latter situation, pod securement mechanism 41 may be actuated to engage a surface of the reticle pod 40 prior to placing the combination of the reticle pod conversion plate 10 and the reticle pod 40 on the tool 71.

Figure 11:
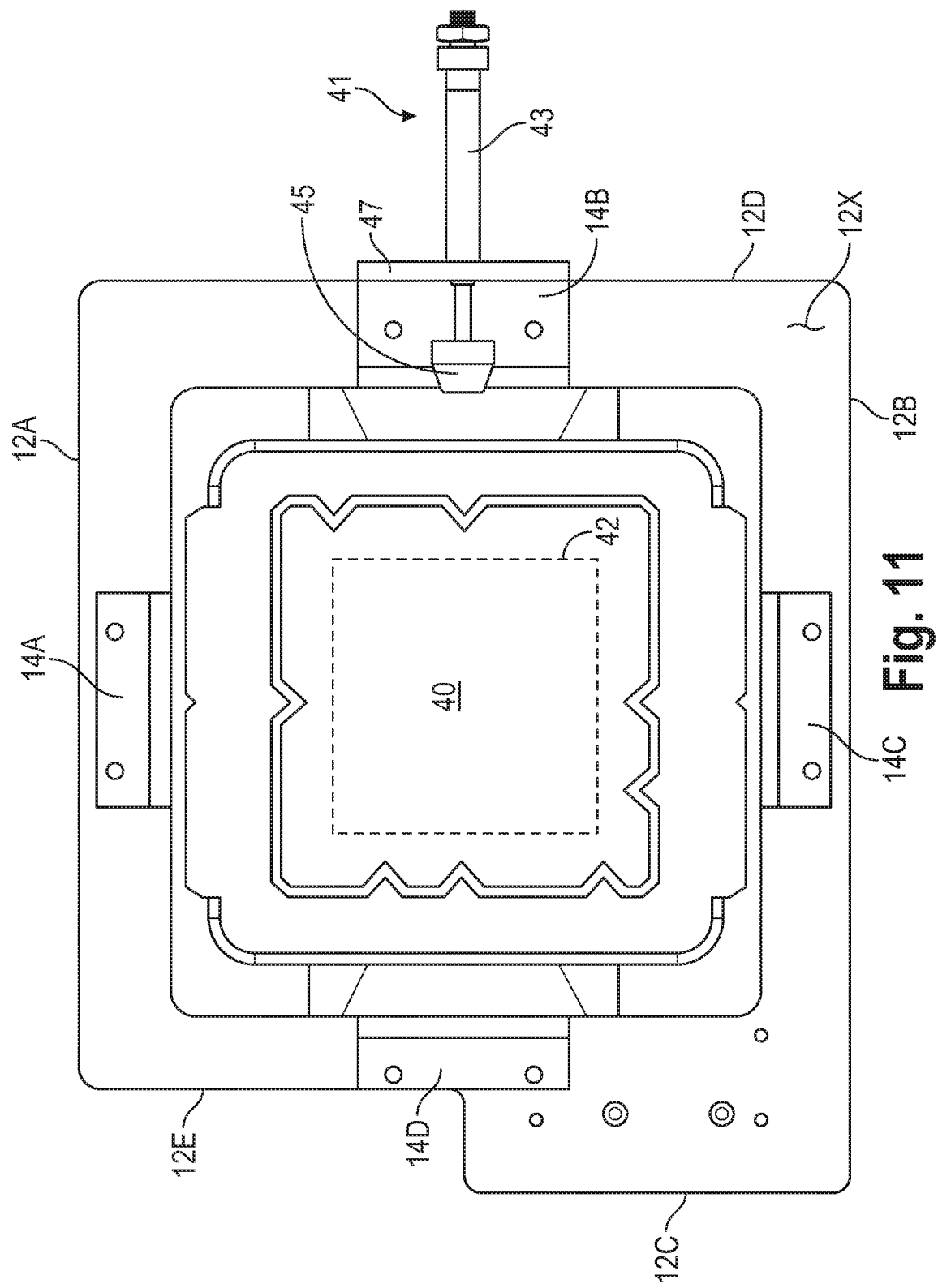
FIG. 11 is a top view of one illustrative embodiment of a novel reticle pod conversion plate disclosed herein with an illustrative reticle pod positioned thereon.

With reference to FIG. 11, the reticle pod 40 is adapted to have a reticle 42 (depicted by a dashed line) positioned therein. The reticle 42 is only depicted in FIG. 11 so as not to obscure the presently disclosed inventions. However, as will be appreciated by those skilled in the art after a complete reading of the present application, the reticle storage pod 40 may or may not have a reticle 42 positioned therein when the reticle storage pod 40 is positioned in the reticle pod receiving area 16. Typically, when the reticle pod 40 (with the reticle 42 positioned therein) is positioned on a purged storage location (not shown), a pressurized inert gas (e.g., argon) atmosphere is introduced into the interior region of the reticle pod 40. The inert gas may be injected into the reticle pod 40 via one or both of two check valves (not shown) that are typically present in the bottom of the reticle pod 40.

In terms of use, when the reticle pod 40 is positioned in the receiving area 16 of the reticle pod conversion plate 10, the pin 33 (see FIG. 1) engages and opens the check valve (not shown) in the bottom of the reticle pod 40 and, when the reticle pod 40 is fully positioned within the reticle pod receiving area 16, the gasket 34 sealingly engages the bottom surface of the reticle pod 40, thereby establishing fluid communication between the interior of the reticle pod 20 and the fluid flow channel 56 via the opening 36 in the first cover plate 31. Once the combination of the reticle pod conversion plate 10 and the reticle pod 40 is positioned on the surface 71A of the tool 71 (and secured thereto by actuating the plate securement mechanism 71B) the suction mechanism 71C of the tool is extended such that the end of the suction mechanism sealingly engages the surface 51A of the second cover plate 51 and surrounds the opening 53 in the second cover plate 51. This establishes fluid communication between the tool 71 and the interior of the reticle pod 40 (via the opening 53, the opening 61, the fluid flow channel 56 and the opening 36) such that fluid, such as air, liquid or gas, etc., may be exchanged between the tool 71 and the reticle pod 40.

As will be appreciated by those skilled in the art after a complete reading of the present application, the tool 71 is adapted to perform a variety of operations with respect to the reticle pod 40. For example, in one embodiment, the tool 71 may be a particle analyzer tool that is adapted to obtain a sample of fluid from within the reticle pod 40 and measure the particle count of the sampled fluid. In other embodiments, the tool 71 may be adapted to measure molecular contaminants, moisture, VOCs, HF and any other compounds traditionally used in semiconductor manufacturing of the sampled fluid. In other applications, the tool 71 may be adapted to clean the interior region of the reticle pod 40 by injecting a gas at a very high flow rate and/or by liquid injection and removal followed by drying the interior region of the reticle pod 40. After a complete reading of the present application, those skilled in the art will appreciate that there are various tools 71 within a semiconductor fabrication facility that may be used to perform various different operations on a reticle pod 40. Thus, the inventions disclosed herein should not be considered to be limited to any particular type of tool or any particular operation performed on the reticle pod 40.

Normally, within a semiconductor fabrication facility, and with respect to an illustrative operation such as moisture analysis, there will be a first tool that is sized and dedicated to processing only FOUPs and a second tool that is sized and dedicated to processing only reticle pods. However, by use of the novel reticle pod conversion plate 10 disclosed herein, an operation (e.g., moisture analysis) on a reticle pod 40 may be performed on a tool 71 that was initially designed to perform such an operation on only FOUPs. That is, by using the reticle pod conversion plate 10, the fabrication facility does not have to purchase and maintain separate dedicated tools for performing the same operation on both FOUPs and reticle pods, thereby reducing cost and the unnecessary consumption of valuable floor space within the fabrication facility.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
a plate having a front surface and a back surface, the back surface being positioned opposite the front surface;
a reticle pod receiving structure on the front surface, the reticle pod receiving structure at least partially bounding a reticle pod receiving area on the front surface, the back surface having a pin engagement structure, the pin engagement structure being adapted to engage a plurality of pins; and
a fluid flow channel including:
a recess within the plate having a first opening extending from the back surface of the plate to the recess; and
a first cover plate coupled to the plate and covering the recess, the first cover plate having a second opening in fluid communication with the first opening, wherein the fluid flow channel fluidly couples an interior region of a reticle pod in the reticle pod receiving area to the back surface of the plate.

2. The device of claim 1, wherein the plurality of pins comprises three SEMI standard load port pins and wherein the reticle pod receiving structure comprises a plurality of individual reticle pod receiving guides.

3. The device of claim 1, wherein the fluid flow channel comprises a fluid flow conduit and wherein at least a portion of the fluid flow conduit is mechanically supported, either directly or indirectly, by the plate.

4. The device of claim 1, further comprising:
a securement opening extending from the front surface of the plate to the back surface of the plate; and
a securement surface positioned adjacent the securement opening the securement surface having a surface that is positioned at a level that is below a level of the front surface.

5. The device of claim 1, further comprising a reticle pod securement mechanism that is operatively coupled to at least one of the plate or the reticle pod receiving structure, wherein the reticle pod securement mechanism is adapted to engage a surface of a reticle pod to secure the reticle pod in the reticle pod receiving area.

6. The device of claim 1, wherein the pin engagement structure comprises a plurality of channels, wherein each of the plurality of channels is adapted to engage one of the plurality of pins.

7. The device of claim 1, wherein the recess has a bottom surface.

8. The device of claim 1, further comprising:
a second cover plate coupled to the back surface of the plate; and
a third opening in the second cover plate, wherein the third opening is in fluid communication with the first opening.

9. The device of claim 1, further comprising:
a pin having an uppermost surface that is positioned at a level that is above a level of an upper surface of the first cover plate; and
a gasket positioned around the pin and on the upper surface of the first cover plate.

10. A device, comprising:
a plate having a front surface and a back surface, the back surface being positioned opposite the front surface;
a reticle pod receiving structure on the front surface, the reticle pod receiving structure at least partially bounding a reticle pod receiving area on the front surface, the back surface having a pin engagement structure, the pin engagement structure including an indentation adapted to engage a plurality of pins within the plate, wherein the indentation includes a first segment having a first orientation, and a second segment connected to the first segment and having a second orientation, wherein a length of the first segment is longer than a length of the second segment;
a securement opening extending from the front surface of the plate to the back surface of the plate; and
a securement surface positioned adjacent the securement opening, the securement surface having a surface that is positioned at a level that is below a level of the front surface.

11. The device of claim 10, further comprising a reticle pod plate securement mechanism that is operatively coupled to at least one of the plate or the reticle pod receiving structure, wherein the reticle pod plate securement mechanism is adapted to engage a surface of a reticle pod to secure the reticle pod in the reticle pod receiving area.

12. The device of claim 10, further comprising a fluid flow channel that is adapted to allow fluid communication with an interior region of a reticle pod when the reticle pod is positioned in the reticle pod receiving area.

13. The device of claim 12, wherein at least portion of the fluid flow channel is positioned within the plate.

14. The device of claim 12, wherein the fluid flow channel comprises a fluid flow conduit and wherein at least a portion of the fluid flow conduit is mechanically supported, either directly or indirectly, by the plate.

15. The device of claim 12, wherein the fluid flow channel comprises:
a recess formed in the plate;
a first opening in fluid commination with the recess, the first opening extending from the back surface of the plate to the recess; and
a first cover plate positioned above the recess.

16. A device, comprising:
a plate having a front surface and a back surface, the back surface being positioned opposite the front surface;
a reticle pod receiving structure on the front surface, the reticle pod receiving structure at least partially bounding a reticle pod receiving area on the front surface, the back surface having a pin engagement structure, the pin engagement structure including an indentation adapted to engage a plurality of pins within the plate, wherein the indentation includes a first segment having a first orientation, and a second segment connected to the first segment and having a second orientation, wherein a length of the first segment is longer than a length of the second segment; and
a reticle pod plate securement mechanism that is operatively coupled to at least one of the plate or the reticle pod receiving structure, wherein the reticle pod plate securement mechanism is adapted to engage a surface of a reticle pod to secure the reticle pod in the reticle pod receiving area.

17. The device of claim 16, further comprising:
a fluid flow channel that is adapted to allow fluid communication with an interior region of a reticle pod when the reticle pod is positioned in the reticle pod receiving area;
a securement opening extending from the front surface of the plate to the back surface of the plate; and
a securement surface positioned adjacent the securement opening, the securement surface having a surface that is positioned at a level that is below a level of the front surface.

18. The device of claim 17, wherein at least portion of the fluid flow channel is positioned within the plate.

19. The device of claim 10, wherein the first orientation and the second orientation are each substantially perpendicular to the back surface of the reticle pod receiving structure.

20. The device of claim 16, wherein the first orientation and the second orientation are each substantially perpendicular to the back surface of the reticle pod receiving structure.

* * * * *